United States Patent [19]
Yamaguchi et al.

[11] Patent Number: 5,275,960
[45] Date of Patent: Jan. 4, 1994

[54] METHOD OF MANUFACTURING MIS TYPE FET SEMICONDUCTOR DEVICE WITH GATE INSULATING LAYER HAVING A HIGH DIELECTRIC BREAKDOWN STRENGTH

[75] Inventors: Takehisa Yamaguchi; Masahiro Shimizu, both of Hyogo, Japan

[73] Assignee: Mitsubishi Denki Kabushiki Kaisha, Tokyo, Japan

[21] Appl. No.: 878,387

[22] Filed: May 28, 1992

Related U.S. Application Data

[62] Division of Ser. No. 676,580, Mar. 29, 1991, Pat. No. 5,134,452.

[30] Foreign Application Priority Data

Apr. 3, 1990 [JP] Japan .................. 2-89503

[51] Int. Cl.$^5$ .......................... H01L 21/265
[52] U.S. Cl. .......................... 437/41; 437/42; 437/44; 437/162
[58] Field of Search ............. 437/41, 42, 193, 162, 437/29, 203; 257/356, 315

[56] References Cited

U.S. PATENT DOCUMENTS

| | | |
|---|---|---|
| 3,899,474 | 8/1975 | Antipov . |
| 4,466,172 | 8/1984 | Batra ............... 437/42 |
| 4,697,330 | 10/1987 | Paterson et al. ........... 437/42 |
| 4,758,530 | 7/1988 | Schubert . |
| 4,771,012 | 9/1988 | Yabu et al. ............... 435/35 |
| 4,791,074 | 12/1988 | Tsunashima et al. . |
| 4,803,173 | 2/1989 | Sill et al. ............... 437/29 |
| 4,843,023 | 6/1989 | Chiu et al. . |
| 4,855,247 | 8/1989 | Ma et al. . |
| 4,954,867 | 9/1990 | Hosaka . |
| 4,978,629 | 12/1990 | Komori et al. ............ 437/41 |
| 4,992,388 | 2/1991 | Pfiester ............... 437/41 |
| 5,021,851 | 6/1991 | Haken et al. . |
| 5,175,118 | 12/1992 | Yoneda ............... 437/30 |

FOREIGN PATENT DOCUMENTS 61-16573 1/1986 Japan .

OTHER PUBLICATIONS

Huang et al., "A MOS Transistor with Self-Aligned Polysilicon Source-Drain," IEEE Electron Device Letters, vol. 7, No. 5, May 1986, pp. 314–316.

Primary Examiner—Olik Chaudhuri
Assistant Examiner—H. Jey Tsai
Attorney, Agent, or Firm—Lowe, Price, LeBlanc & Becker

[57] ABSTRACT

An MIS transistor includes insulating layers formed by the CVD method as gate insulating layers. The gate insulating layers by the CVD method are formed having a uniform film thickness on the channel region surface roughed by etching treatment or the like. The dielectric breakdown strength of the gate insulating layer is thus assured.

4 Claims, 10 Drawing Sheets

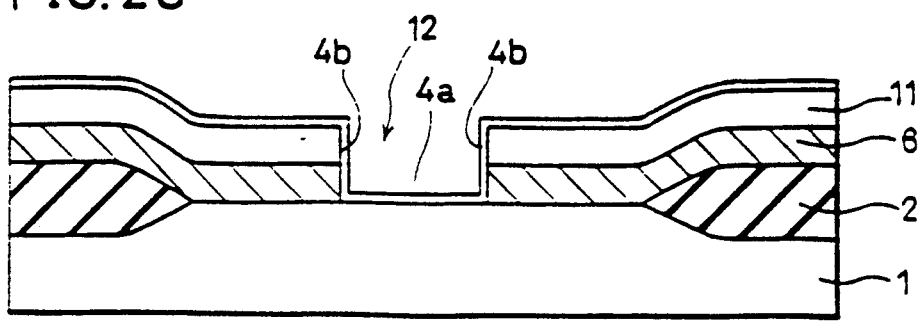
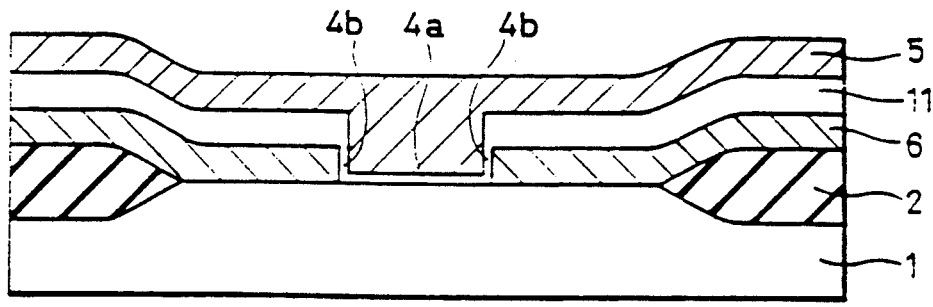
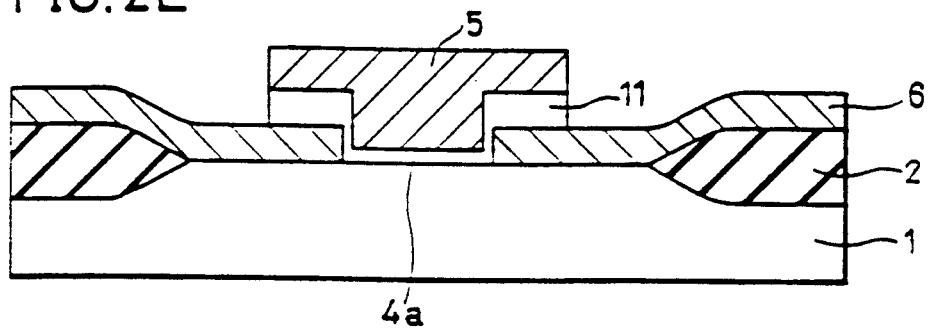
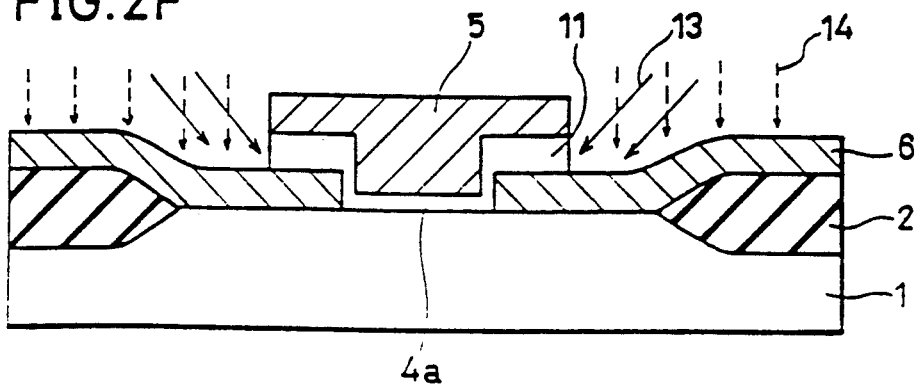

FIG. 14 PRIOR ART
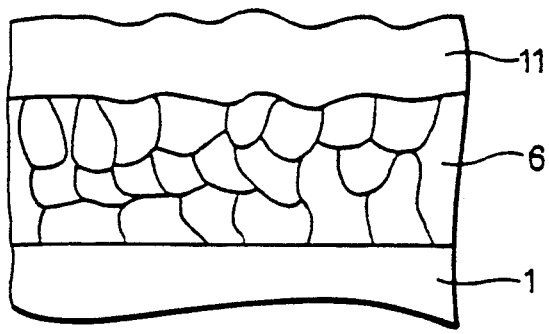
FIG. 15 PRIOR ART
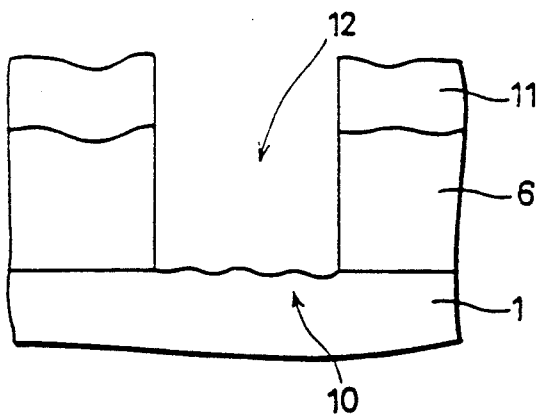
FIG. 16 PRIOR ART
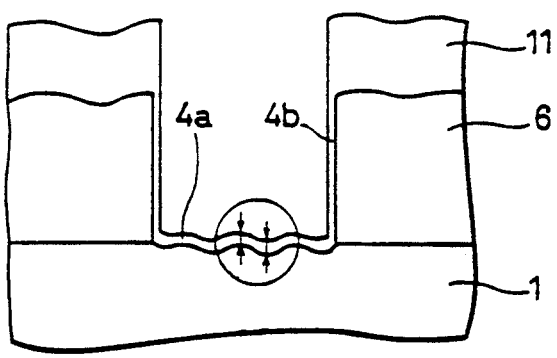
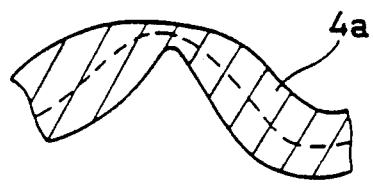
FIG. 17 PRIOR ART

METHOD OF MANUFACTURING MIS TYPE FET SEMICONDUCTOR DEVICE WITH GATE INSULATING LAYER HAVING A HIGH DIELECTRIC BREAKDOWN STRENGTH

This application is a division of application Ser. No. 07/676,580 filed Mar. 29, 1991, now U.S. Pat. No. 5,134,452.

BACKGROUND OF THE INVENTION

1. Field of the Invention

The present invention relates to a semiconductor device, and particularly to an improvement of characteristic of a gate insulating film of a MIS (Metal-Insulator-Semiconductor) type semiconductor device.

2. Description of the Background Art

In a semiconductor integrated circuit device, a MIS type field effect transistor (MIS FET) is one of the important components. A MOS FET is a kind of MIS type FET, which employs an oxide film as an insulator. FIG. 12A is a sectional structure view showing a sectional structure of a conventional typical MOS FET. The MOS FET includes a pair of source/drain regions 3, 3, a gate oxide film 4 and a gate electrode 5. The MOS FET is formed in a region surrounded by a field oxide film 2 on a p type silicon substrate.

For the requirements of miniaturizing semiconductor device structures, in the MOS FET, the gate length is reduced. Furthermore, it is required to reduce a film thickness of gate oxide film 4. Gate oxide film 4 is made thinner in order to restrain the short channel effect caused by reducing the gate length. If the gate length is 0.3 μm, for example, it is needed to implement gate oxide film 4 with a film thickness of 100 Å or less. Thinning gate oxide film 4 caused the following problems.

FIG. 12B is an enlarged view of a gate region of a MOS transistor. A conventional gate oxide film 4 is formed by thermally oxidizing a main surface of silicon substrate 1.

Usually, a native oxide film 40 having a surface roughness of approximately 20 Å is formed on the main surface of silicon substrate 1. Accordingly, when a gate oxide film 4 is formed by thermally oxidizing the surface of silicon substrate 1 on which the native oxide film 40 is formed, a portion "A" with a large film thickness and a portion "B" with a small thickness are formed in gate oxide film 4. The film thickness of gate oxide film 4 is smaller on a convex portion of the native oxide film 40 and the film thickness of gate oxide film 4 is larger on a concave portion of the native oxide film 40. Accordingly, gate oxide film 4 is formed having uneven film thickness, in which the breakdown voltage is reduced in a portion with a small film thickness. As described above, if gate oxide film 4 with a film thickness of 100 Å or less is to be formed, the breakdown voltage of the gate oxide film further decreases because the effect of the surface roughness of the native oxide film 40 relatively increases. A certain experiment shows that, when an oxide film of an average film thickness of 100 Å is formed, the film thickness of the oxide film formed in a corner portion in a lower layer is reduced to 40 Å.

Accordingly, a MOS transistor having a gate oxide film of the film thickness of 100 Å or less has a disadvantage that it cannot use a thermal oxide film as a gate oxide film.

Also, problems similar to that described above are caused in other MOS devices. For example, a conventional PSD (Polysilicon Source and Drain) transistor will be described. A PSD transistor described below is disclosed in Japanese Patent Laying Open No. 61-16573, for example. FIG. 13G is a sectional structural view of a PSD transistor. Referring to FIG. 13G, a thick field oxide film 2 for element isolation is formed in a given region of a main surface of a p type silicon substrate 1. A pair of n type impurity regions 3, 3 are formed at intervals of a given distance in the main surface region of the p type silicon substrate 1 surrounded by field oxide film 2. Respective source/drain electrode layers 6, 6 formed of polycrystal silicon having conductivity are connected to the surface of the pair of n type impurity regions 3, 3, respectively. The source/drain electrode layers 6, 6 extend on the field oxide film 2. The main surface region of the p type silicon substrate 1 disposed between the pair of n type impurity regions 3, 3 constitutes a channel region 10 of the transistor. Relatively thin gate insulating films 4a, 4b are formed on the surface of the channel region 10. Furthermore, a gate electrode 5 formed of polysilicon provided with conductivity is formed on the surface of the gate insulating films 4a, 4b. The gate electrode 5 is insulated and isolated from the source/drain electrode layers 6 by the gate insulating films 4b. Furthermore, a part of the gate electrode 5 extends above these source/drain electrode layers 6, 6. The surface of the PSD transistor is covered with a thick interlayer insulating layer 7. Contact holes 8 which reach the source/drain electrode layers 6, 6 are formed in the interlayer insulating layer 7. Interconnection layers 9 are connected to the source/drain electrode layers 6, 6 through the contact holes 8.

A feature of this PSD transistor structure is that the n type impurity regions 3, 3 are formed in a self-aligning manner with respect to the source/drain electrode layers 6, 6, and that a part of the gate electrode 5 extends above the source/drain electrode layers 6, 6.

Next, the process of manufacturing the PSD transistor will be described. FIGS. 13A–13G are manufacturing process sectional views illustrating the process of manufacturing a PDS transistor. First, referring to FIG. 13A, a thick field oxide film 2 is formed in a given region on a main surface of a p type silicon substrate 1 using the LOCOS (Local Oxidation of Silicon) method. Next, a polysilicon layer 6 is deposited on the main surface of the p type silicon substrate 1 and impurity ions are implanted for providing it with conductivity. On the surface of polysilicon layer 6, undulation on the order of 500 Å is formed.

Next, as shown in FIG. 13B, a silicon oxide film 11 is deposited on the surface of the polysilicon layer 6 by the chemical vapor deposition (CVD) method.

Furthermore, referring to FIG. 13C, a portion of the silicon oxide film 11 and the polysilicon layer 6 in which a gate is to be formed is selectively removed by plasma dry etching method to form an opening portion 12. The surface of the p type silicon substrate 1 is exposed in the opening portion 12.

Next, referring to FIG. 13D, it is heat-treated in an oxidizing atmosphere to form silicon oxide films 4a, 4b on the exposed surface of the p type silicon substrate 1 in the opening portion 12 and on the side surfaces of the polysilicon layers 6 facing the opening portion 12. Subsequently, performing thermal treatment in a nitriding atmosphere, the impurity introduced into the polysilicon layer 6 is diffused into the p type silicon substrate 1. Thus, n type impurity regions 3, 3 are formed.

Furthermore, referring to FIG. 13E, a doped polysilicon layer 5 is deposited on the surface of the insulating layer 11 and the gate insulating layers 4a, 4b.

Furthermore, referring to FIG. 13F, the polysilicon layer 5 and the insulating layer 11 are patterned into given form using the lithography method and the etching method to form a gate electrode 5 and an insulating layer 11b.

Subsequently, referring to 13G, after forming a thick interlayer insulating layer 7, contact holes 8 which reach the source/drain electrode layers 6, 6 are formed. Next, aluminum interconnection layers 9 are formed connected to the source/drain regions 6 through the contact holes 8. In the above process, a PSD transistor is manufactured.

A problem with the PSD transistor manufactured by the above described method is that the thickness of the gate insulating film 4a is not uniform. The non-uniformity of film 4A degrades the gate breakdown voltage. A description thereof will be made below. FIG. 14 is a partial sectional structure drawing including the channel region 10 in the step shown in FIG. 13B. The surface of the polysilicon layer 6 becomes rough corresponding to the shape of the grains. Also, the surface condition of the insulating layer 11 formed on the polysilicon layer 6 surface similarly becomes rough reflecting the surface shape of the polysilicon layer 6.

Next, FIG. 15 is an enlarged sectional view of an opening portion 12 formed as shown in FIG. 13C. As the insulating layer 11 having a rough surface shape and the polysilicon layer 6 are etched and removed away, the channel region 10 surface of the p type silicon substrate 1 surface is also formed as an uneven plane with large undulation reflecting this surface shape. Specifically, this is because the surface of the silicon substrate 1 is also continually etched, since the polysilicon layer 6 and the silicon substrate 1 have no etching selectivity.

FIG. 16 is a partial enlarged view of the channel of the PSD transistor provided with the gate insulating films 4a, 4b by the step shown in FIG. 13D. When a silicon oxide film is formed by the thermal oxidation method on the surface of the channel region 10 having a rough surface shape, the thickness of the silicon oxide film becomes thin at a sharp convex portion, and edge dislocation is produced in extreme cases. Accordingly, for the entire gate insulating layer 4a, the thickness becomes uneven. Thus, the gate dielectric breakdown voltage is degraded where the film is thin, so that the gate dielectric breakdown voltage is degraded for the entire gate oxide film 4a. Such problems are serious in a range of a film thickness of gate insulating film 4a of less than about 200 Å.

As described above, in a conventional MIS transistor, an insulating layer formed by thermal oxidation is less suitable as a gate insulating layer of a transistor as a gate insulating layer becomes thinner.

SUMMARY OF THE INVENTION

It is an object of the present invention to enhance the dielectric breakdown voltage of a gate insulating layer.

It is another object of the present invention to enhance the dielectric breakdown voltage of a gate insulating layer of a so-called PSD transistor.

It is still another object of the present invention to form a gate insulating layer with uniform thickness on a single crystal silicon layer surface having irregularity.

A MIS semiconductor device according to the first aspect of the present invention includes a single crystal silicon layer, an insulating layer formed by the chemical vapor deposition method on the surface of the single crystal silicon layer, and an electrode layer formed on the surface of the insulating layer and for applying predetermined voltage between the single crystal silicon layer and itself.

Furthermore, the MOS type semiconductor device according to the second aspect of the present invention includes a single crystal silicon layer of a first conductivity type having a main surface. A pair of impurity regions of a second conductivity type spaced apart from each other are formed in the main surface of the single crystal silicon layer. A pair of conductive layers are formed on the surface of the pair of impurity regions, and a first insulating layer is formed by the chemical vapor deposition method on the surface of the single crystal silicon layer located between the pair of impurity regions. A gate electrode layer is formed on the surface of the first insulating layer with its portion formed above the conductive layer surfaces with the second insulating layers provided therebetween. The MIS type semiconductor device manufacturing method according to the present invention comprises the steps of forming an insulating layer using the chemical vapor deposition method on the surface of the single crystal silicon layer, and forming an electrode layer on the surface of the insulating layer.

An insulating layer formed by the chemical vapor deposition method, such as a silicon oxide film or a silicon nitride film, has an excellent lower layer covering ability as compared to a thermal oxide film or the like, so that it can provide uniform thickness. Accordingly, it can be formed as a film having even thickness of 200 Å or less even when the lower single crystal silicon layer surface is rough, i.e. having surface undulations on the order of 500 Å, so that good dielectric breakdown voltage can be maintained.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2A, 2B, 2C, 2D, 2E, 2F, 2G and 2H are manufacturing process sectional views of the PSD transistor shown in FIG. 1 at the manufacturing steps.

FIG. 14 is a partial sectional and enlarged view of FIG. 13B.

FIG. 15 is a partial sectional and enlarged view of a PSD transistor shown in FIG. 13C.

FIG. 16 is a partial sectional and enlarged view of a PSD transistor shown in FIG. 13D.

FIG. 17 is an enlarged view of the circled portion of gate insulating layer 4a depicted in FIG. 16.

DESCRIPTION OF THE PREFERRED EMBODIMENTS

Figure 1:
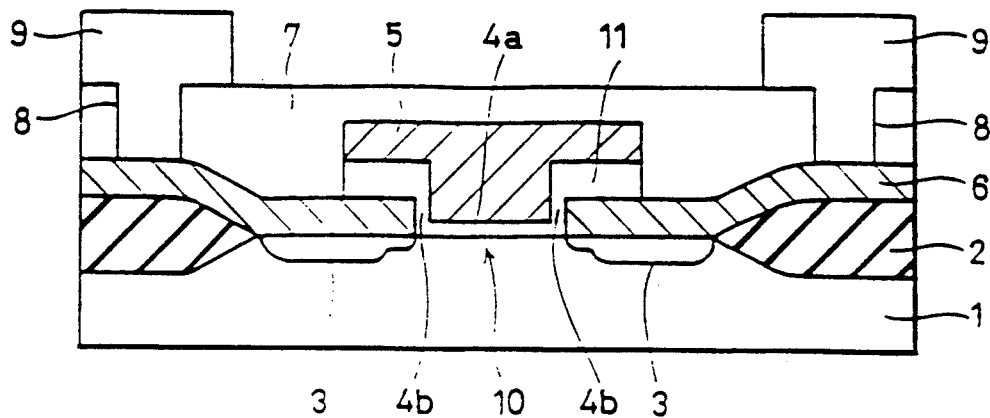
FIG. 1 is a sectional structural view of a PSD transistor according to the first embodiment of the present invention.

Referring to FIG. 1, a thick field oxide film 2 is formed by the LOCOS method in a given region on the main surface of the p type silicon substrate 1. A pair of n type impurity regions 3, 3 to be source/drain regions are formed in the p type silicon substrate 1 surface surrounded by the field oxide film 2. The n type regions 3, 3 have so-called LDD (Lightly Doped Drain) structure composed of a relatively low concentration region and a relatively high concentration region. The p type silicon substrate 1 surface region disposed between the n type impurity regions 3, 3 becomes a channel region 10 of the transistor. Source/drain electrode layers 6, 6 composed of polysilicon having conductivity are formed on the surface of the n type impurity regions 3, 3. The source/drain electrodes 6, 6 further extend on the field oxide film 2. A gate electrode 5 is formed on the surface of the channel region 10 with the gate insulating films 4a, 4b provided therebetween. The gate electrode 5 is composed of a conductive polysilicon. A portion of the gate electrode 5 has structure extending over the source/drain regions 6, 6 with the insulating layer 11 provided therebetween. The surface of the PSD transistor is covered with a thick interlayer insulating layer 7. Contact holes 8 which reach the source/drain electrode layers 6, 6 are formed in the interlayer insulating layer 7. Interconnection layers 9, 9 composed of, e.g., aluminum, refractory metal or the like are formed on the surface of the interlayer insulating layer 7, which are connected to the source/drain electrode layers 6, 6 through the contact holes 8.

Figure 11:
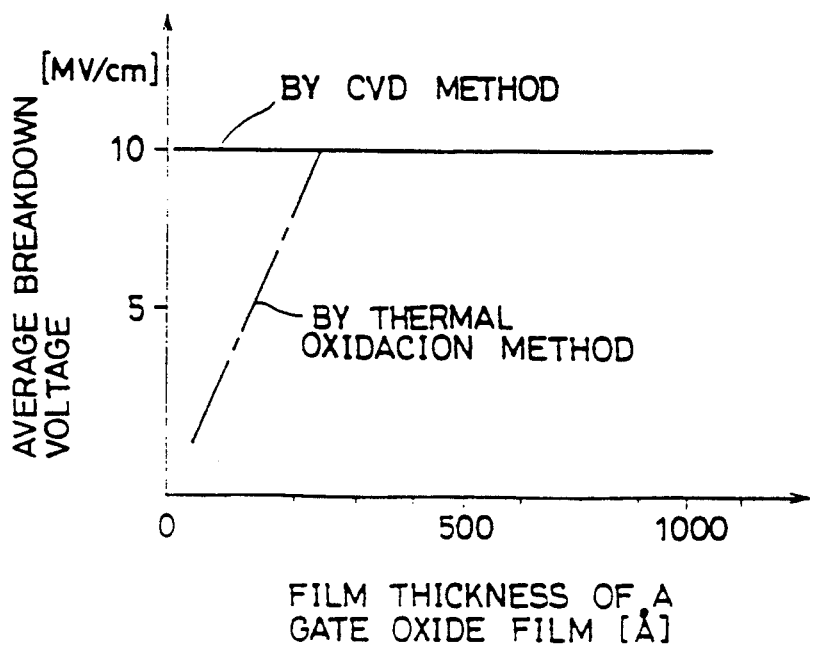
FIG. 11 is a relative diagram showing the relationship between a film thickness of a gate insulating film of an MOS FET and the breakdown voltage.
Figure 12A:
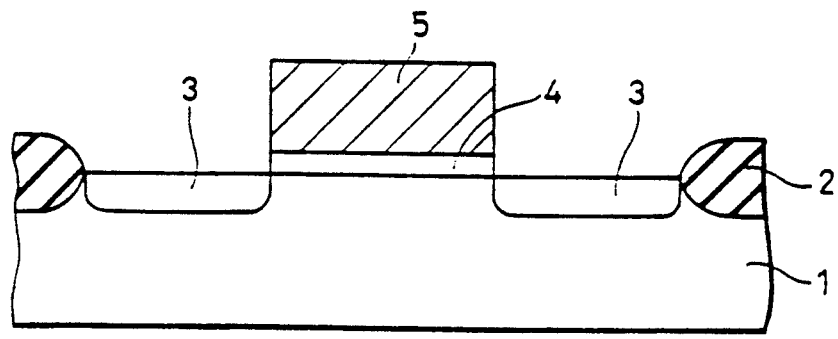
FIG. 12A is a sectional structure view of a conventional typical MOS FET.
Figure 12B:
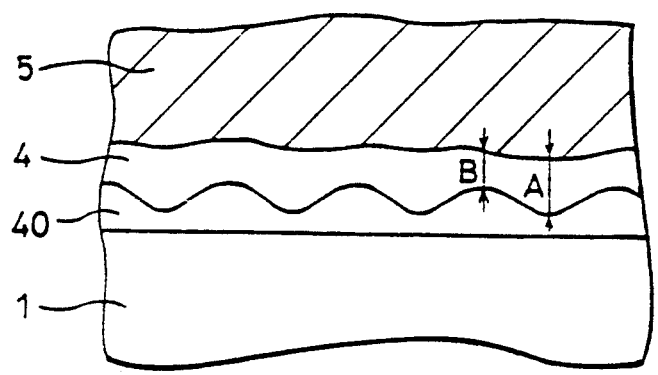
FIG. 12B is a partial enlarged view of a MOS FET of FIG. 12A.
Figure 13A:
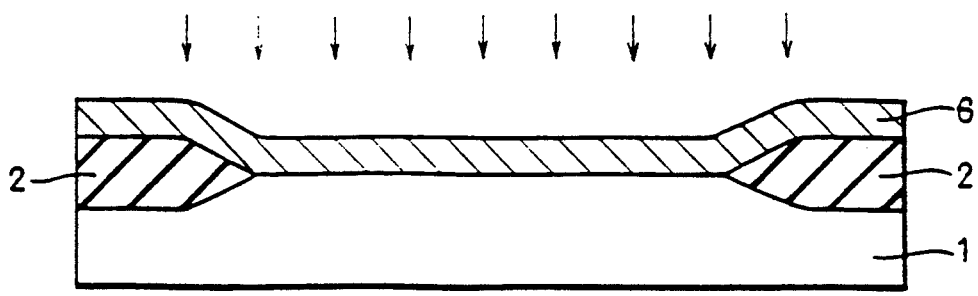
FIGS. 13A, 13B, 13C, 13D, 13E, 13F and 13G are sectional views of a conventional PSD transistor at the manufacturing steps.
Figure 13B:
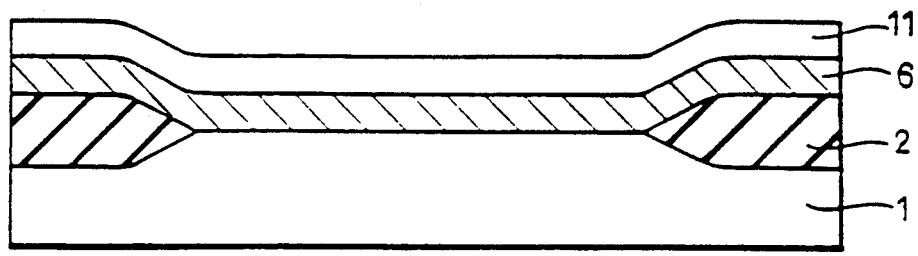
Figure 13C:
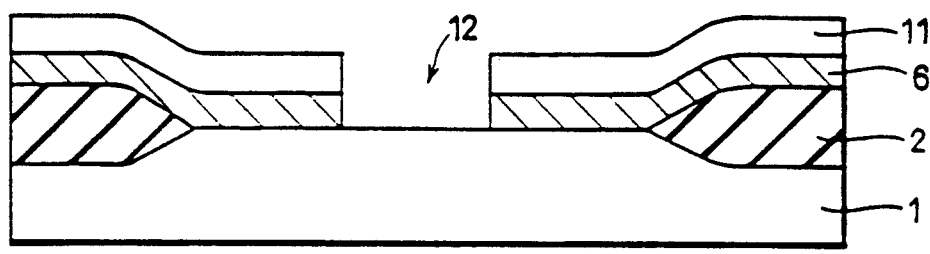
Figure 13D:
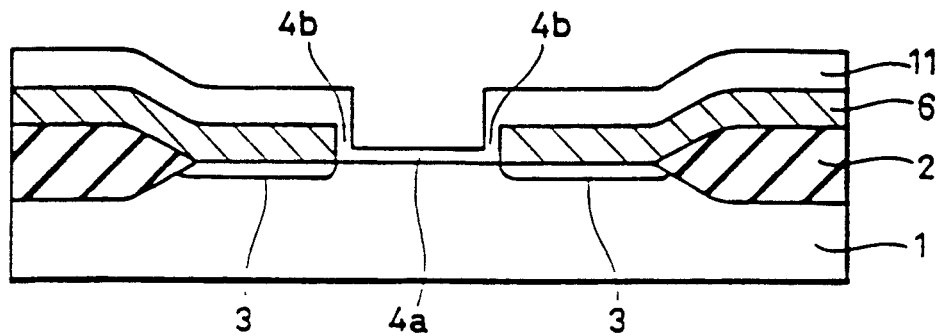
Figure 13E:
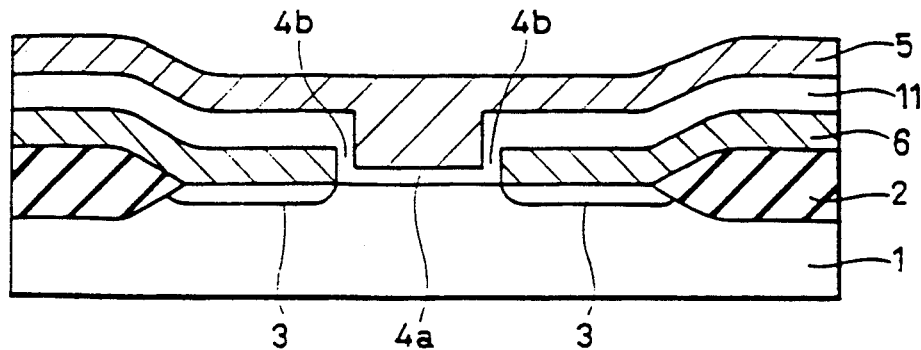
Figure 13F:
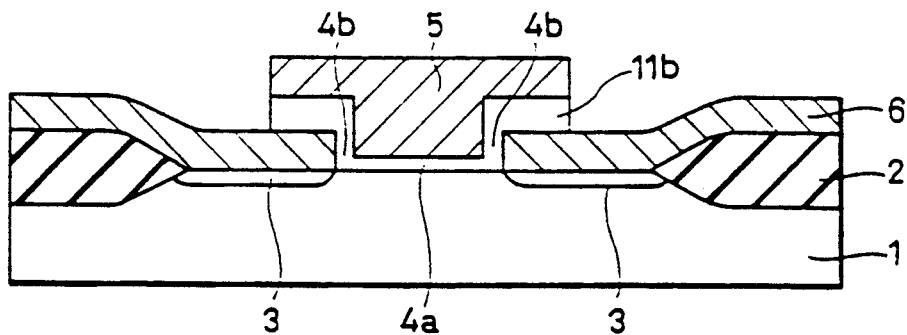
Figure 13G:
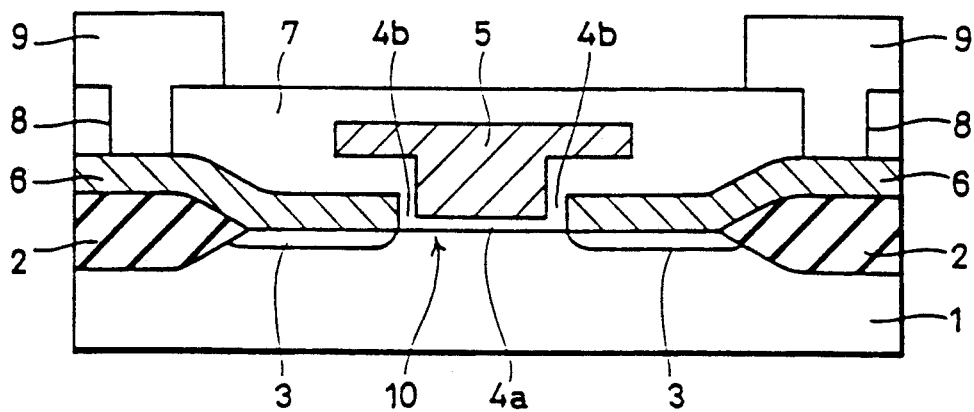

The gate insulating layers 4a, 4b are composed of a silicon oxide film or a silicon nitride film formed by the CVD method, or multiple films composed of a silicon oxide film and a silicon nitride film. The CVD insulating film has a better covering capability as compared to a thermal oxide film, so that a uniform film thickness can be obtained. Thus, the gate dielectric breakdown voltage can be enhanced. As shown in FIG. 11, in the CVD insulating film, the breakdown voltage does not vary almost at all in a range of the film thickness less than about 200 Å.

Next, the process of manufacturing the PSD transistor shown in FIG. 1 will be described. FIGS. 2A-2H are manufacturing process sectional views of the PSD transistor. First, referring to FIG. 2A, a field oxide film 2 is formed using the LOCOS method in a given region on the surface of the p type silicon substrate 1. Next, a polysilicon layer 6 with a film thickness of 2000 Å is deposited using the CVD method on the surface of the silicon substrate 1. Furthermore, a silicon oxide film 11 with a film thickness of 2000 Å is deposited on the surface.

Figure 2A:
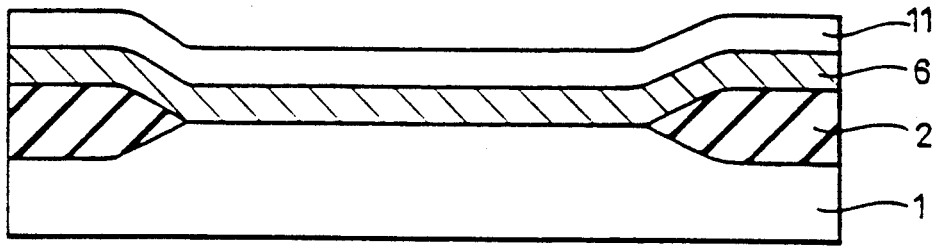
Figure 2B:
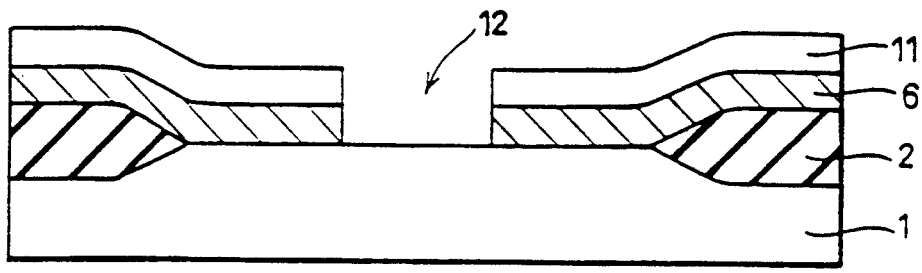
Figure 3:
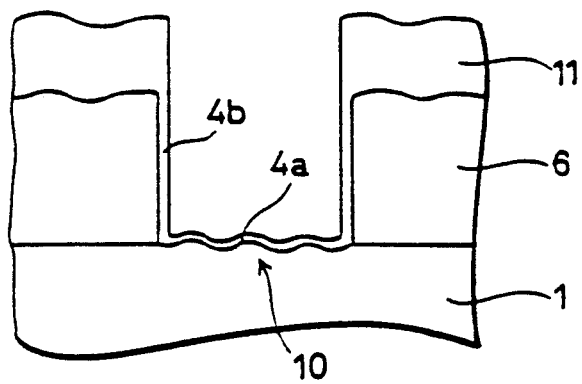
FIG. 3 is a partial enlarged view of the PSD transistor shown in FIG. 2C.

Next, referring to FIG. 2B, the silicon oxide film 11 and the polysilicon layer 6 are selectively removed using the photolithography method and the etching method to form an opening portion 12 for forming a gate. As the etching method, the reactive ion etching (RIE) is employed, for example. FIG. 3 is an enlarged view of the opening portion 12 and the vicinity thereof after the etching, similar to the structure shown in FIG. 15 described in the "Description of the Background Art" has as illustrated, the channel region 10; a rough surface condition. That is, a rough surface having surface roughness or undulations on the order of 500 Å is formed on the surface of the channel region 10.

Furthermore, referring to FIG. 2C, silicon oxide films 4a, 4b are formed having film thickness of 150 Å using the CVD method inside the opening portion 12 and on the surfaces of the silicon oxide film 11. In this CVD process, a silicon oxide film is formed in about 6.5 minutes using monosilane ($SiH_4$) and dinitrogen oxide ($N_2O$) gases at a temperature of 850° C. The condition of this formed silicon oxide film is also shown in FIG. 3. As shown in the figure, the silicon oxide film 4a formed by the CVD method has a characteristic that it covers sufficiently even the rough surface of the channel region 10 of the silicon substrate 1 with a uniform film thickness.

Next, referring to FIG. 2D, a polysilicon layer 5 with a film thickness of 3500 Å is formed all over the silicon substrate 1 using the CVD method.

Furthermore, referring to FIG. 2E, the polysilicon layer 5 and the silicon oxide film 11 are patterned into a predetermined shape, using the photolithography method and the etching method, to form a gate electrode 5. The gate electrode 5 has a T-shaped structure in which both ends extend over the surface of the source/drain electrode layers 6, 6 with the silicon oxide film 11 provided therebetween.

Furthermore, referring to FIG. 2F, first, low concentration phosphorus ions 13 in a dose of $10^{14}/cm^2$ or less are implanted into the source/drain electrode 6 by the rotation oblique ion implantation method using the gate electrode 5 as a mask. By this ion implantation, the low concentration phosphorus ions 13 are also introduced into the source/drain regions 6, 6 portions covered with the gate electrode 5. Next, high concentration arsenic ions 14 in a dose of about $10^{15}/cm^2$ are vertically ion-implanted into the source/drain electrode layers 6, 6 using the gate electrode 5 as a mask. By this technique, high concentration arsenic ions are implanted into the source/drain electrode layers 6, 6 except for the portions thereof covered with the gate electrode 5.

Figure 2G:
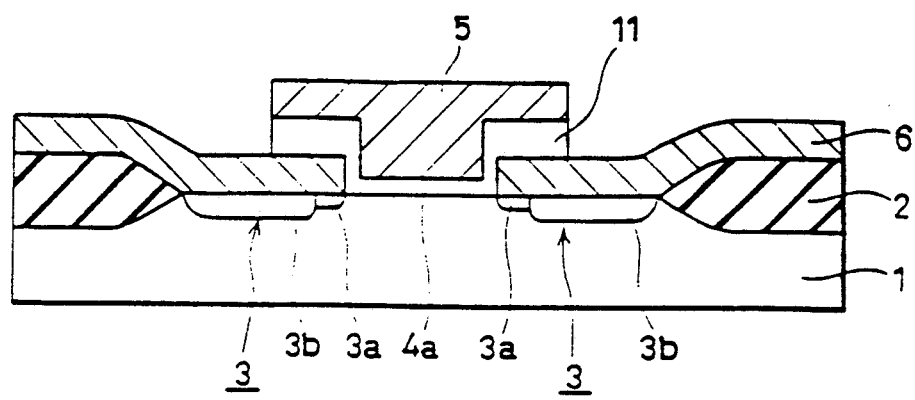

Furthermore, referring to FIG. 2G, the high concentration arsenic ions 14 and the low concentration phosphorus ions 13 included in the source/drain electrode layers 6, 6 are diffused into the p type silicon substrate 1 surface by high temperature thermal treatment. The low concentration phosphorus is diffused from the region covered with the gate electrode 5 and the high concentration arsenic and phosphorus are diffused from the region not covered with the gate electrode 5 in the source/drain electrode layers 6, 6. Thus, each source/- drain regions 3 has LDD structure composed of a relatively low concentration diffusion region 3a and a relatively high concentration diffusion region 3b.

Figure 2H:
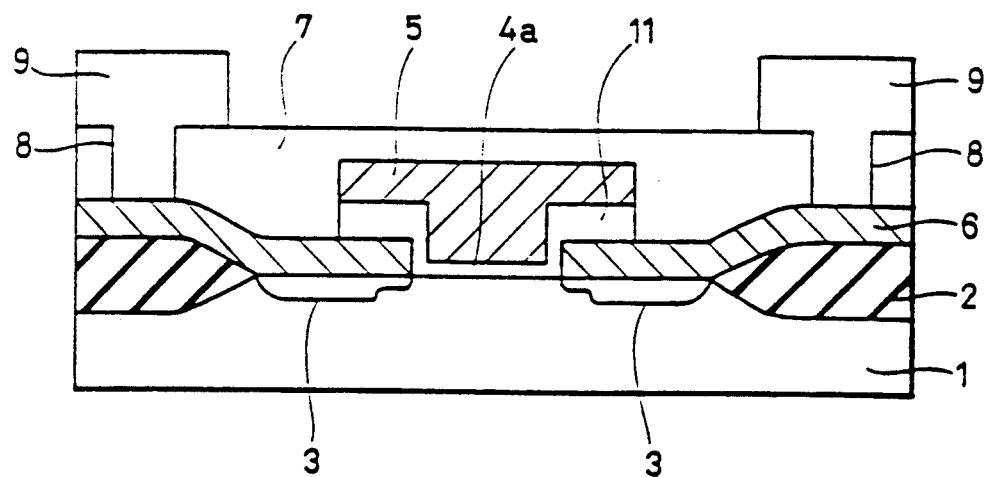

Subsequently, referring to FIG. 2H, a thick interlayer insulating layer 7 is formed all over the surface, and contact holes 8 are formed in given regions. Furthermore, interconnection layers 9 are formed on the surface of the interlayer insulating layer 7. The interconnection layers 9 are connected to the source/drain electrode layers 6, 6 through the contact holes 8.

Figure 4:
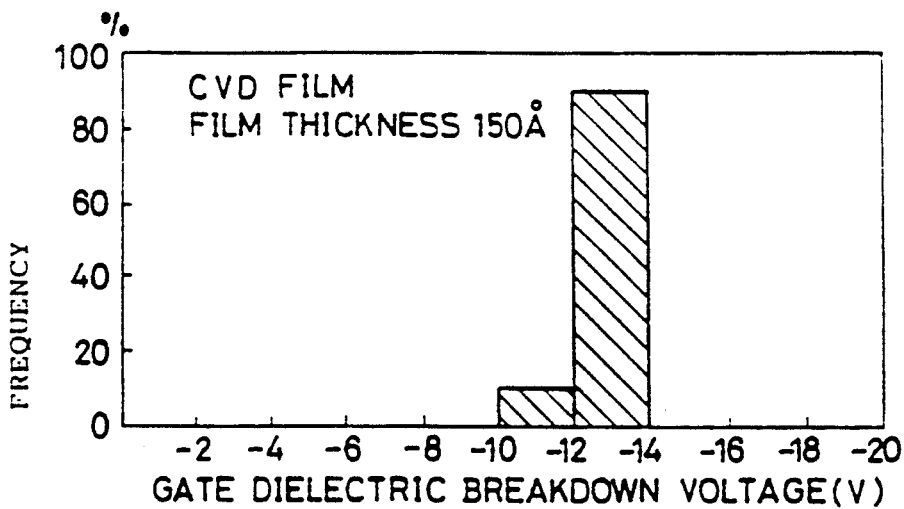
FIGS. 4 and 5 are gate dielectric breakdown voltage distribution diagram of a PSD transistor in the first embodiment and a conventional one.
Figure 5:
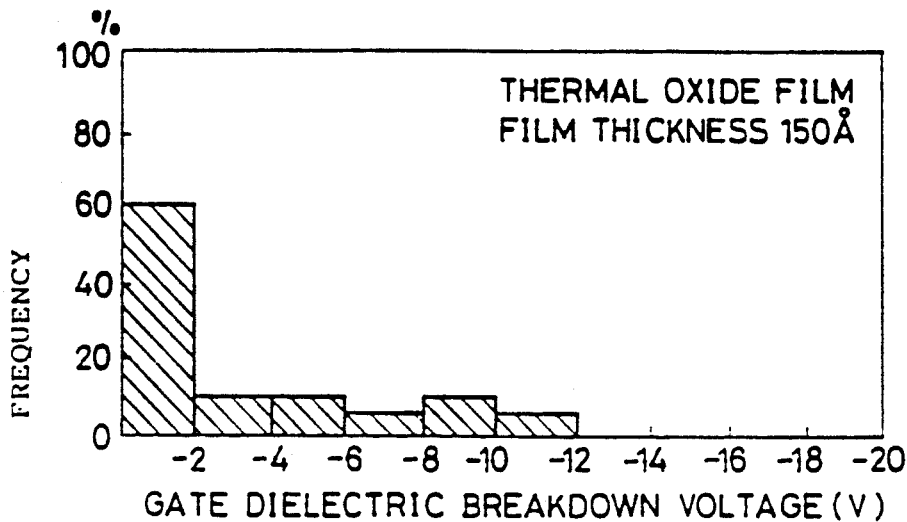

The results of a gate dielectric breakdown voltage test of a PSD transistor manufactured by the above described process and a PSD transistor formed by a conventional method are shown in FIGS. 4 and 5. FIG. 4 shows the gate dielectric breakdown voltage of the PSD transistor in accordance with this invention, and FIG. 5 shows the gate dielectric breakdown voltage of a conventional PSD transistor. As clearly seen by comparing the two figures, the gate insulating film of the PSD transistor in accordance with the present invention has dielectric breakdown voltage much higher than a conventional one. Furthermore, FIG. 11 shows the relationship between a film thickness of a gate oxide film formed on a surface of a layer having surface roughness or undulations on the order of 500 Å and the breakdown voltage. In a gate oxide film formed by thermal oxidation, in a range of a film thickness of 200 Å or less the breakdown voltage rapidly decreases. In a gate oxide film formed by the CVD method, a constant breakdown voltage is maintained regardless of a decrease in the film thickness.

Figure 6:
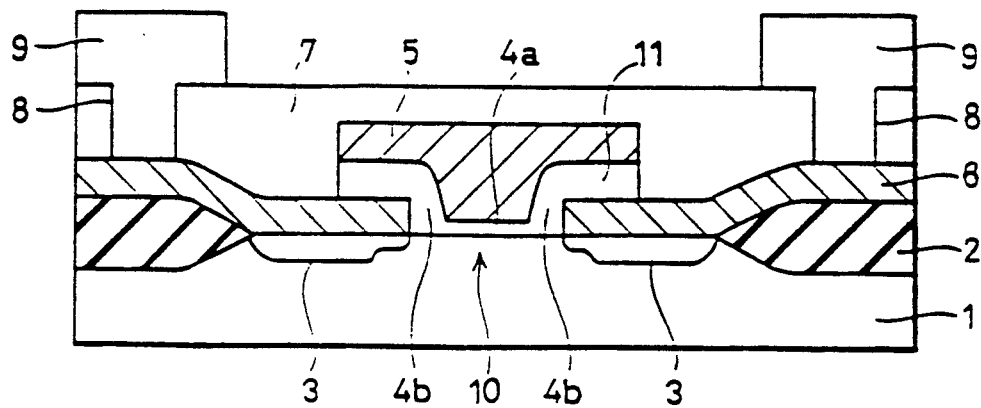
FIG. 6 is a sectional structural view of a PSD transistor according to the second embodiment of the present invention.
Figure 7A:
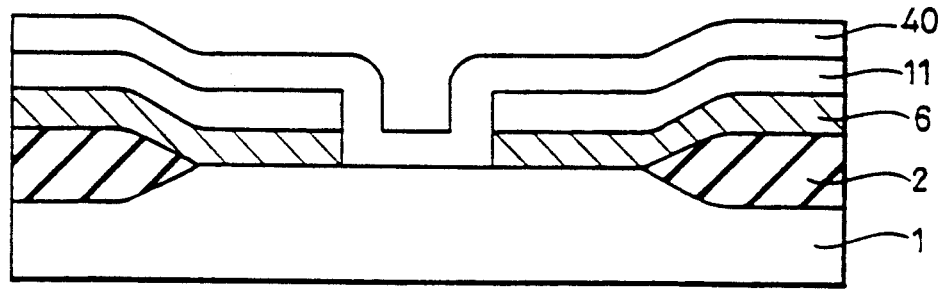
FIGS. 7A and 7B are sectional views of a PSD transistor shown in FIG. 6 at the major manufacturing steps.
Figure 7B:
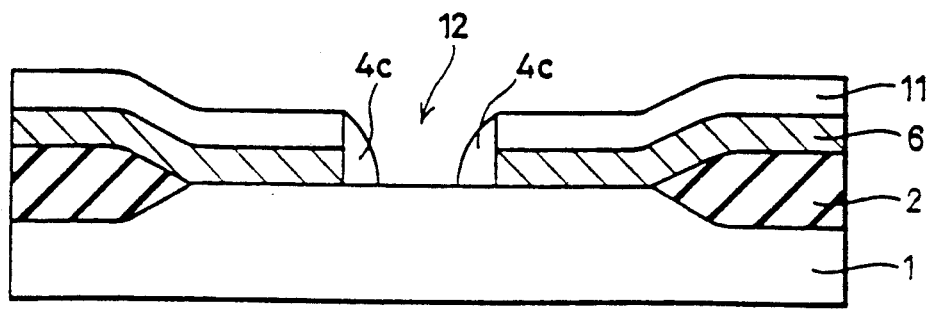

Next, the second embodiment of this invention, which is a modification of the first embodiment, will be described. Compared with the first embodiment shown in FIG. 1, in the second embodiment shown in FIG. 6, the film thickness of the gate insulating layers 4b formed between the source/drain electrode layers 6, 6 and the gate electrode 5 is larger than that of the gate insulating layer 4a. FIGS. 7A and 7B show sectional views in manufacturing steps in the second embodiment further added to the manufacturing steps of the first embodiment. That is to say, the steps of FIGS. 7A and 7B are performed after the step shown in FIG. 2B in the first embodiment. First, referring to FIG. 7A, a silicon oxide film 40 is deposited all over the silicon substrate 1 surface.

Next, referring to FIG. 7B, the silicon oxide film 40 is anisotropically-etched using RIE or the like. In this way, sidewall spacers 4c, 4c of the silicon oxide film are formed only on the sidewalls in the opening portion 12.

After this, the step shown in FIG. 2C of the first embodiment is performed. That is to say, silicon oxide films 4a, 4b by the CVD method are formed on the silicon substrate 1 surface exposed in the opening portion 12, the sidewall spacers 4c and the surface of the silicon oxide film 11.

In this embodiment, compared to the first embodiment, the dielectric breakdown voltage between the gate electrode 5 and the source/drain electrode layers 6, 6 is enhanced. This embodiment is disclosed in the previous application (Japanese Patent Application No. Hei-1-86011) by the same inventor.

Figure 8:
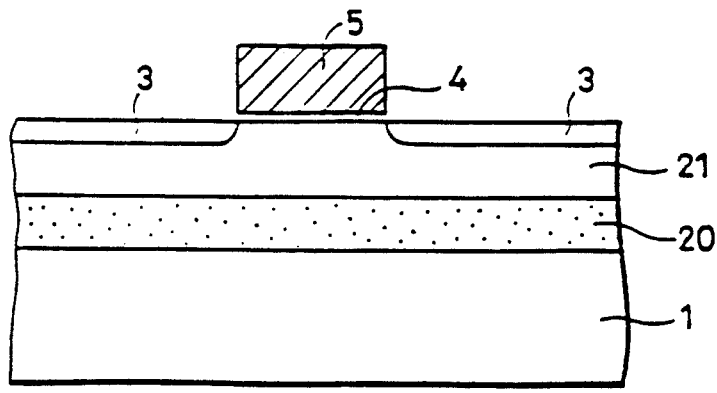
FIG. 8 is a sectional structural view of a MOS transistor formed having a SOI structure according to the third embodiment of the present invention.

Next, the third embodiment of this invention will be described referring to FIG. 8. FIG. 8 is a sectional structure view of a MIS transistor of so called SOI (Silicon On Insulator) structure. In the SOI structure, an insulating layer 20 is formed on the surface of the first polycrystal silicon substrate 1, and a second single crystal silicon layer 21 is further formed on the surface of the insulating layer 20. The surface of the second single crystal silicon layer 21 is made relatively irregular. Accordingly, when a gate oxide film is formed thereon by thermal oxidation, a problem similar to that described in relation to the background art occurs. Therefore, in the MIS transistor formed on the surface of the second single crystal silicon layer 21, a gate insulating layer 4 is formed by the CVD method.

Figure 9:
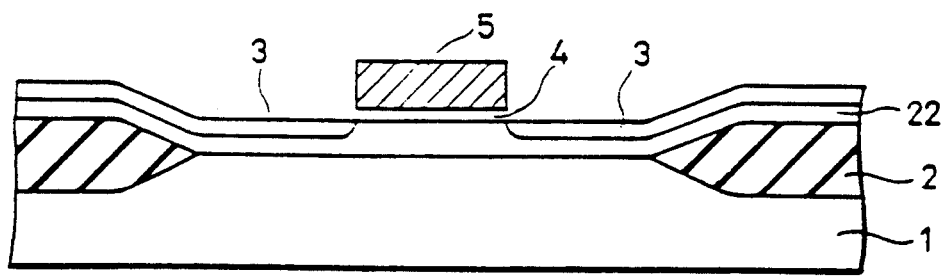
FIG. 9 is a sectional structure view of a MOS transistor formed on the SPE layer according to the fourth embodiment of the present invention.
Figure 10A:
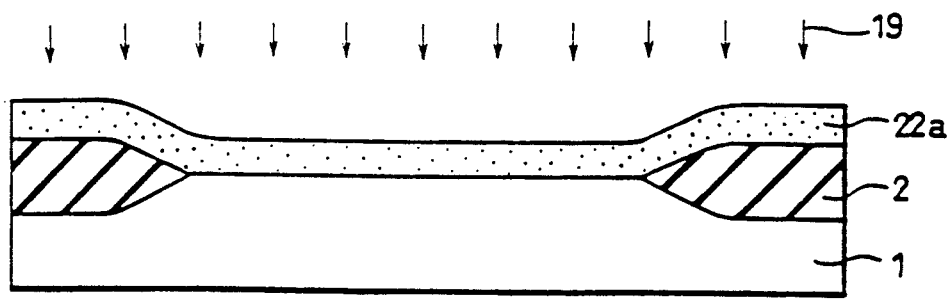
FIGS. 10A and 10B are sectional views of a MOS transistor of FIG. 9 at the major manufacturing steps.
Figure 10B:
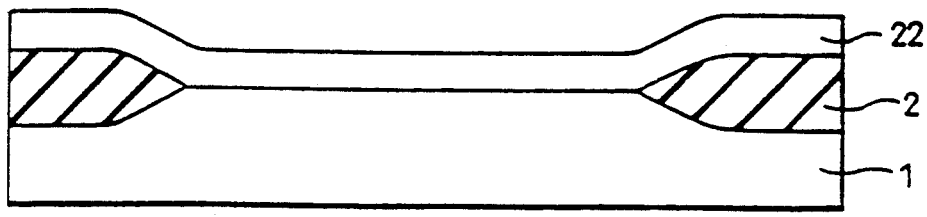

Furthermore, the fourth embodiment of the present invention will be described. FIG. 9 is a sectional structure view of a MIS transistor formed on a so-called SPE (Solid Phase Epitaxy). A solid phase epitaxial layer 22 is formed on the surface of the silicon substrate 1. The MIS transistor is formed on the surface of the solid phase epitaxial layer 22. FIGS. 10A and 10B are sectional views showing steps of manufacturing process of the solid phase epitaxial layer 22. Referring to FIG. 10A, a polysilicon layer 22a is deposited on the silicon substrate 1 surface by the CVD method. Then, silicon ions 19 are implanted into the polysilicon layer 22a in a dose of $10^{15}/cm^2$ to make it amorphous.

Next, referring to FIG. 10B, the amorphous silicon layer 22a is single-crystallized by anneal treatment. Thus, a solid phase epitaxial layer 22 composed of single crystal silicon is formed. Also, when a MIS transistor is formed on the surface of this solid phase epitaxial layer 22, as in the case of the above described SOI, a problem of degradation of the gate dielectric breakdown voltage due to the surface irregularity is encountered. Accordingly, the gate insulating layer 4 by the CVD method is formed on the surface of the solid phase epitaxial layer 22. In this way, a MIS transistor having better dielectric breakdown voltage compared to a gate insulating layer by the thermal oxidation can be formed.

While a silicon oxide film by the CVD method has been described as a gate insulating layer, a CVD nitride film formed using monosilane ($SiH_4$) and ammonium ($NH_3$) gases may be employed. Furthermore, a multiple film which is formed by, after forming a CVD oxide film, performing nitriding treatment, to form a nitride film on the surface thereof, may be employed.

As described above, according to the present invention, a semiconductor device having high reliability with enhanced dielectric breakdown voltage can be implemented by forming a gate insulating layer by the CVD method on a single crystal silicon layer surface.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a MIS type semiconductor device comprising an insulating layer formed on a single crystal silicon layer surface, and an electrode layer formed on the surface of said insulating layer and for applying a predetermined voltage between said single crystal silicon layer and itself, comprising the steps of:

forming a single crystal silicon layer on a substrate, a surface of the single crystal silicon layer having a surface undulation on the order of 500 Å;

forming an insulating layer comprising a silicon oxide film having a thickness of 200 Å or less, using a chemical vapor deposition method, on said surface of the single crystal silicon layer; and forming an electrode layer on the surface of said insulating layer.

2. A method of manufacturing a field effect semiconductor device comprising an conductive layer on a surface of a source/drain region, comprising the steps of:

forming a single crystal silicon layer having a surface undulation on the order of 500 Å, forming a polycrystal silicon layer and a first insulating layer on the surface of said single crystal silicon layer, exposing a surface region of the surface of said single crystal silicon layer by selectively etching and removing said polycrystal silicon layer and said first insulating layer, forming a second insulating layer comprising a silicon oxide layer having a thickness not more than 200 Å using a chemical vapor deposition method on the side of said polycrystal silicon layer, on the surface of said exposed single crystal silicon layer and on the surface of said first insulating layer, forming a gate electrode by, after forming a conductive layer on the surface of said second insulating layer, patterning it into a shape, introducing impurity into said polycrystal silicon layer, and diffusing the impurity introduced into said polycrystal silicon layer into said single crystal silicon layer.

3. The method according to claim 2, wherein:

said second insulating layer forming step comprises the step of forming a silicon nitride film on said silicon oxide film, using a chemical vapor deposition method.

4. The method according to claim 2, wherein:

said second insulating film forming step comprises the step of forming a nitride film on the surface of said silicon oxide film by thermal nitriding treatment of said silicon oxide film.

* * * * *